(12) United States Patent
Heres et al.

(10) Patent No.: US 10,714,296 B2
(45) Date of Patent: Jul. 14, 2020

(54) ION SOURCE WITH TAILORED EXTRACTION SHAPE

(71) Applicant: Axcelis Technologies Inc., Beverly, MA (US)

(72) Inventors: Patrick T. Heres, Boxford, MA (US); Denis A. Robitaille, Ipswich, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 16/217,664

(22) Filed: Dec. 12, 2018

(65) Prior Publication Data

US 2020/0194219 A1 Jun. 18, 2020

(51) Int. Cl.
*H01J 27/02* (2006.01)
*H01J 37/08* (2006.01)
(Continued)

(52) U.S. Cl.
CPC ............ *H01J 27/024* (2013.01); *H01J 37/08* (2013.01); *H01J 37/09* (2013.01);
(Continued)

(58) Field of Classification Search
CPC ........ H01J 37/08; H01J 37/09; H01J 37/3171; H01J 2237/0455; H01J 2237/31701; H01J 2237/061; H01J 27/024
See application file for complete search history.

(56) References Cited

U.S. PATENT DOCUMENTS

| | | | |
|---|---|---|---|
| 5,026,997 | A | 6/1991 | Benveniste |
| 5,420,415 | A | 5/1995 | Trueira |

(Continued)

FOREIGN PATENT DOCUMENTS

| | | |
|---|---|---|
| JP | S60243952 A | 12/1985 |
| JP | H04160745 A | 6/1992 |
| TW | M541108 U | 5/2017 |

OTHER PUBLICATIONS

International Search Report and Written Opinion dated Apr. 9, 2020 in connection with PCT/US2019/059994.

*Primary Examiner* — Brooke Purinton
(74) *Attorney, Agent, or Firm* — Denis A. Robitaille, Esq.

(57) ABSTRACT

An ion implantation system including an ion source for use in creating an ion beam is disclosed. The ion source has an ion source arc chamber housing that confines a high density concentration of ions within the chamber housing. An extraction member defining an appropriately configured extraction aperture allows ions to exit the source arc chamber. In a preferred embodiment, the extraction member defines a tailored extraction aperture shape for modifying an ion beam profile and producing a substantially uniform beam current across a dimension of the ion beam. The extraction aperture member defines an aperture in the form of an elongated slit having a width that varies, with wide ends and a narrow middle. The midsection of the extraction aperture has a narrower width than the opposite end sections. The tailored shape of the extraction aperture includes a central portion having a first width dimension, and first and second distal portions extending from opposite sides of the central portion, the opposed distal portions having a second width dimension that is greater than the first width dimension of the central portion.

17 Claims, 7 Drawing Sheets

(51) Int. Cl.
*H01J 37/317* (2006.01)
*H01J 37/09* (2006.01)

(52) U.S. Cl.
CPC ... *H01J 37/3171* (2013.01); *H01J 2237/0455* (2013.01); *H01J 2237/061* (2013.01); *H01J 2237/31701* (2013.01)

(56) References Cited

U.S. PATENT DOCUMENTS

| | | | |
|---|---|---|---|
| 5,497,006 A | | 3/1996 | Sferlazzo et al. |
| 5,959,396 A | * | 9/1999 | Moreshead ............. H01J 37/08 313/363.1 |
| 7,453,074 B2 | | 11/2008 | Eisner et al. |
| 8,089,052 B2 | | 1/2012 | Tieger et al. |
| 2006/0022144 A1 | * | 2/2006 | Cha ....................... H01J 27/024 250/426 |
| 2008/0099696 A1 | | 5/2008 | Ryding et al. |
| 2012/0248328 A1 | * | 10/2012 | Renau ................... H01J 27/024 250/398 |
| 2016/0111250 A1 | * | 4/2016 | Sato ........................ H01J 37/08 313/153 |
| 2016/0111254 A1 | * | 4/2016 | Evans ..................... C23C 14/48 216/66 |
| 2019/0139742 A1 | * | 5/2019 | McLaughlin ......... H01J 27/024 |

* cited by examiner

ION SOURCE WITH TAILORED EXTRACTION SHAPE

FIELD OF THE INVENTION

The present invention relates generally to an ion implanter having an ion source for generating and emitting ions to form an ion beam for treatment of a workpiece or wafer and, more specifically, to an ion source having a tailored extraction aperture (otherwise known as an "arc slit") for providing improved ion beam uniformity characteristics, particularly in the case of high aspect ratio ion beams originating from the ion source.

BACKGROUND ART

Ion implanters are well known and have been used for many years in the field of semiconductor manufacturing to modify workpieces such as silicon wafers. In simplest terms, these complex systems generate an ion beam that is directed to the wafer for selectively doping the wafer with impurities of controlled concentration and energy, thereby yielding a semiconductor material that forms the foundation for the fabrication of an integrated circuit or a so-called microchip.

A typical ion implanter includes: an ion source; an ion extraction electrode subsystem, a mass analysis device; a beam transport assembly; and a wafer processing station. The ion source typically encompasses a chamber for receiving a dopant material and generating ions of desired atomic or molecular dopant species therefrom. These ions are extracted from the chamber via an extraction member, which typically defines an extraction aperture operating in conjunction with the extraction electrode subsystem, which includes a set of electrodes that energize and direct the flow of ions out of the ion source chamber through the extraction aperture. The desired dopant ions are then separated from other ions and byproducts of the ion source in a mass analysis device, typically a magnetic dipole, performing mass dispersion of the extracted ion beam. The beam transport assembly includes a vacuum system containing a number of various electrostatic and/or magnetic focusing, filtering and acceleration/deceleration components for transporting the ion beam to the wafer processing station while creating and/or maintaining desired properties of the ion beam. Finally, the transported ion beam impinges on wafers that are transferred into and out of the wafer processing station to implant ions from the ion beam into the wafer.

Ion sources that generate the ions used to create the ion beam are well known. For example, commonly assigned U.S. Pat. No. 5,420,415 to Trueira and U.S. Pat. No. 5,497,006 to Sferlazzo et al describe various aspects and details of a typical "Bernas-type" ion source used to generate ions in semiconductor manufacturing equipment. While the contents of the '415 and '006 patents are incorporated herein by reference for all purposes, it will be understood that the present invention can be applied to other types of ion sources, including but not limited to, so-called "Freeman-type" ion sources as well as RF based ion sources used for extracting ion beams.

As previously noted, an ion source typically comprises a chamber, sometimes called: a gas confinement chamber; an arc chamber; or a plasma chamber, which is made up of conductive chamber walls that bound an ionization region. A gas supply is positioned in communication with the gas confinement chamber for delivering an ionizable gas thereto (or for housing a sputterable ionization material therein), as is well known in the art. An electron source is situated with respect to the gas confinement chamber for emitting ionizing electrons into the gas ionization region. In a typical "internally heated cathode" based ion source, a heated cathode is provided in the form of a filament supported inside a conductive body for heating the cathode and causing ionizing electrons to be emitted into the gas confinement chamber.

The gas confinement chamber includes an extraction member defining an extraction aperture, or so-called arc slit for allowing ions to exit the chamber. The gas confinement chamber and extraction aperture are positioned relative to the extraction subsystem so as to create a well-defined ion beam from the ions extracted from and exiting the gas confinement chamber. Thus, ions created within the chamber interior are drawn toward the extraction member and are transported through the extraction aperture to form the ion beam. The extraction aperture may be in the form of an elongated opening or through hole formed in the extraction member. Commonly assigned U.S. Pat. No. 7,453,074, also incorporated by reference herein, discloses that it may be desirable to vary the size and/or shape of the extraction aperture to define different ion beam profiles and/or to vary the ion source operation and various characteristics thereof.

SUMMARY OF THE INVENTION

An ion implanter system including an ion source for use in creating a stream of ions is disclosed. The ion source has an ion source chamber housing that confines a high density concentration of ions within the chamber housing. An extraction member defining an appropriately configured extraction aperture allows ions to exit the source chamber. In a preferred embodiment, a tailored extraction aperture is provided for modifying an ion beam profile and producing a substantially uniform beam current across a dimension of the ion beam.

In one preferred embodiment, the extraction aperture has a tailored shape that is different than a traditional oval or elliptical extraction aperture. That is to say that a typical ion source extraction aperture is provided in the form of an elongated slit in the shape of an oval or an ellipse, usually having a single axis of reflection symmetry extending along the lengthwise direction of the extraction member and/or extraction aperture. In the present invention, the extraction member defines an aperture in the form of an elongated slit having a width that varies with wide ends and a narrow middle, commonly referred to as a "dogbone" shape, wherein a midsection of the extraction aperture has a width that is narrow relative to the opposite end sections.

The present invention is directed to an ion source, including an ion source housing and an associated extraction member defining an extraction aperture having a tailored shape. The ion source defines an ion generating chamber for confining a high density concentration of ions therein, while the extraction member defines an extraction aperture for allowing ions to exit the ion generating to chamber. The tailored shape of the extraction aperture includes a central portion having a first width dimension, and first and second distal portions extending from opposite sides of the central portion, the opposed distal portions having a second width dimension that is greater than the first width dimension of the central portion.

In another embodiment of the invention, an ion implanter is disclosed, wherein the ion implanter comprises an ion source including a housing defining an arc chamber for confining a high density concentration of ions therein, and an extraction member associated with the ion source housing defining an extraction aperture for allowing ions to exit the arc chamber. The extraction aperture has a tailored shape, including: a central portion having a first width dimension; and first and second distal portions extending from opposite sides of the central portion, the opposed distal portions having a second width dimension that is greater than the first width dimension of the central portion.

For convenience of the description, the long direction in which the beam extraction aperture extends may be referred to as the longitudinal direction of the aperture, which corresponds to the longitudinal direction of the ion source chamber. The longitudinal direction of the extraction aperture is perpendicular to the direction of beam extraction from the ion source. Hereinafter, the direction perpendicular to both the longitudinal direction of the aperture and the beam extraction direction may be referred to as the width direction of the aperture. Therefore, the illustrations shown in FIGS. 3A, 3C, 4A, 4C and 6A-D are views of a typical ion beam extraction member with associated extraction aperture, exposed along a plane parallel to the longitudinal direction of the aperture and perpendicular to the beam extraction direction. Thus, in FIGS. 3A, 3C, 4A, 4C and 6A-D, the longitudinal direction of the extraction aperture is in the vertical direction, the aperture width direction is in the horizontal direction, and the beam extraction direction is the direction perpendicular to the paper surface.

Further features of the present invention will become apparent to those skilled in the art to which the present invention relates from reading the following specification with reference to the accompanying drawings.

BRIEF DESCRIPTION OF THE DRAWINGS

FIGS. 3A-3C are illustrations of a PRIOR ART extraction member and extraction aperture defined thereby, wherein

FIGS. 4A-4C are illustrations of a preferred embodiment of the extraction member and extraction aperture of the present invention, wherein

EXEMPLARY EMBODIMENT FOR PRACTICING THE INVENTION

Figure 1:
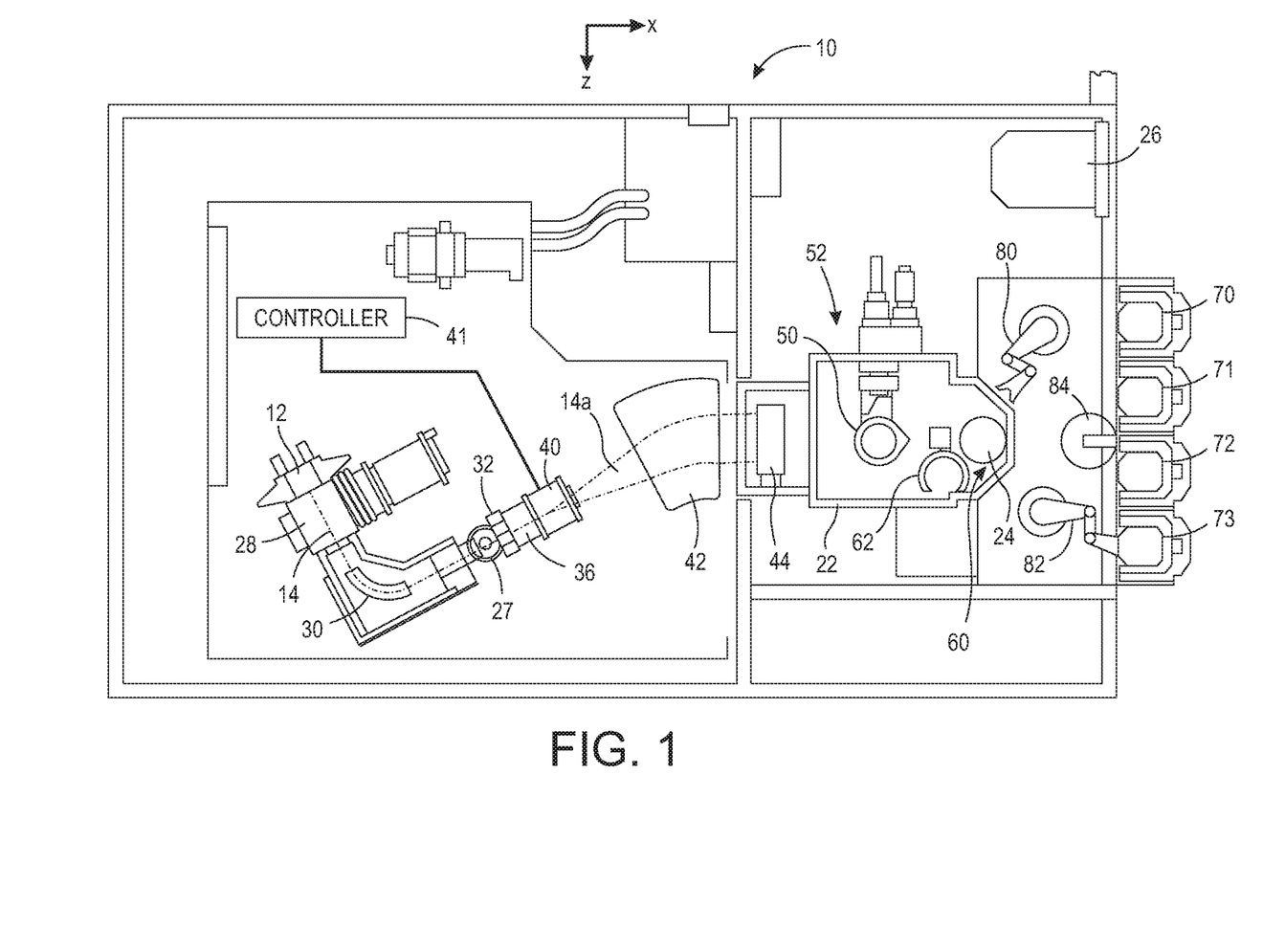
FIG. 1 is schematic view of an ion implanter for ion beam treatment of a workpiece such as a silicon wafer.

Turning to the drawings, FIG. 1 illustrates a schematic depiction of an ion beam implanter 10 having an ion source 12 for creating ions that form an ion beam 14 which is shaped and selectively deflected to traverse a beam path to a process chamber or end station 52. The end station 52 includes a vacuum or implantation chamber 22 defining an interior region in which a workpiece 24, such as a semiconductor wafer, is positioned for implantation by ions that make up the ion beam 14. Control electronics indicated schematically as a controller 41 are provided for monitoring and controlling the ion beam current or dose, as well as aspects and characteristics of the ion beam received by the workpiece 24. Operator input to the control electronics are performed via a user control console 26 located near the end station 52. The implanter is maintained at low pressure by one or more vacuum pumps 27.

The ion source 12 will be described in greater detail hereinbelow. Generally, the ion source includes an ion generating chamber, otherwise known as a plasma arc chamber, defining an interior region into which source materials, which may include an ionizable gas, co gases or vaporized or sputterable source materials, are injected. Ions generated within the ion generating chamber are extracted from the chamber by an ion beam extraction assembly 28, which includes a number of electrodes (not shown) for creating an ion accelerating electric field.

An analyzing magnet 30 is positioned downstream of the ion source 12 for mass analyzing the ion beam 14. The analyzing magnet 30 bends and filters the ion beam 14, directing it through a resolving aperture 32. In the exemplary ion beam implanter illustrated herein, the beam 14 passes through a quadrupole lens system 36 that focuses the beam 14 and then passes through electrostatic deflection electrodes or a scanning magnet 40, which is also controlled by the controller 41. The controller 41 provides an alternating current signal to the scanning magnet, which, in turn, causes the ion beam 14 to repetitively deflect or scan from side to side at a frequency of several hundred Hertz. This oscillating beam deflection, or side to side scanning of the ion beam, generates a thin, fan-shaped ion beam 14a. It will be understood that the present invention is equally applicable to ion beam implantation systems that do not incorporate a scanning system, as for example in a pencil beam system where the wafer is scanned in two orthogonal dimensions in order to expose the entire wafer to the ion beam, or in a ribbon beam system where the ion beam is allowed to diverge along the beam path to form a wide area or ribbon beam to completely cover a diameter of a workpiece such as a silicon wafer.

The exemplary ion beam implanter 10 illustrated herein further includes a parallelizing magnet 42 wherein the deflected ions that make up the beam 14a are again deflected by varying amounts so that they exit the parallelizing magnet 42 moving along generally parallel beam paths. The ions then enter an energy filter 44 that deflects the ions due to their charge to remove neutral particles that may have entered the beam during the upstream beam shaping that takes place. The scanned ion beam 14a that exits the parallelizing magnet 42 is a high aspect ratio ion beam with a cross-sectional shape that is essentially in the form of a very narrow rectangle, having a vertical extent that is limited and an extent in the orthogonal direction that is wide due to the scanning or deflecting caused by the scanning system 40. The scanned ion beam completely covers a diameter of the wafer such that the extent of the scanned ion beam 14a is such that the ions impact an entire surface of the workpiece 24 when the workpiece is also scanned.

A workpiece support structure 50 both supports and moves the workpiece with respect to the scanned ion beam 14 during implantation. Since the implantation chamber interior region is evacuated, workpieces must enter and exit the chamber through a loadlock 60. A robotic arm 62 mounted within the implantation chamber 22 automatically moves wafer workpieces to and from the loadlock 60. A workpiece 24 is shown in a horizontal position within the load lock 60 in FIG. 1. The arm 62 moves the workpiece 24 from the load lock 60 to a support 50 by rotating the workpiece through an arcuate path. Prior to implantation, the workpiece support structure 50 rotates the workpiece 24 to a vertical or near vertical position for implantation.

In a typical implantation operation, undoped workpieces (semiconductor wafers) are retrieved from one of a number of cassettes 70-73 by one of two robots 80, 82, which move a workpiece 24 to a wafer orientation station 84, where the workpiece 24 is rotated to a particular orientation. A robot arm retrieves the oriented workpiece 24 and moves it into the load lock 60. The load lock is pumped down to a desired vacuum pressure, and then opens into the implantation chamber 22. A robotic arm 62 grasps the workpiece 24, brings it within the implantation chamber 22 and places it on a clamping platform or electrostatic chuck associated with the workpiece support structure 50 for holding the workpiece 24 in place as it is scanned in front of the ion beam during implantation.

After ion beam processing of the workpiece 24, the workpiece support structure 50 returns the workpiece 24 to a position where the electrostatic chuck is de-energized to release the workpiece. The robotic arm 62 grasps the workpiece 24 after the ion beam treatment and moves it from the support 50 back into the load lock 60. In accordance with an alternate design the load lock can include multiple regions that are independently evacuated and pressurized and in this alternate embodiment a second robotic arm (not shown) at the implantation station 20 grasps the implanted workpiece 24 and moves it from the implantation chamber 22 back to the load lock 60. From the load lock 60, a robotic arm of one of the robots 80, 82 moves the implanted workpiece 24 back to one of the cassettes 70-73, typically to the cassette from which it was initially withdrawn.

Ion Source 12

Figure 2:
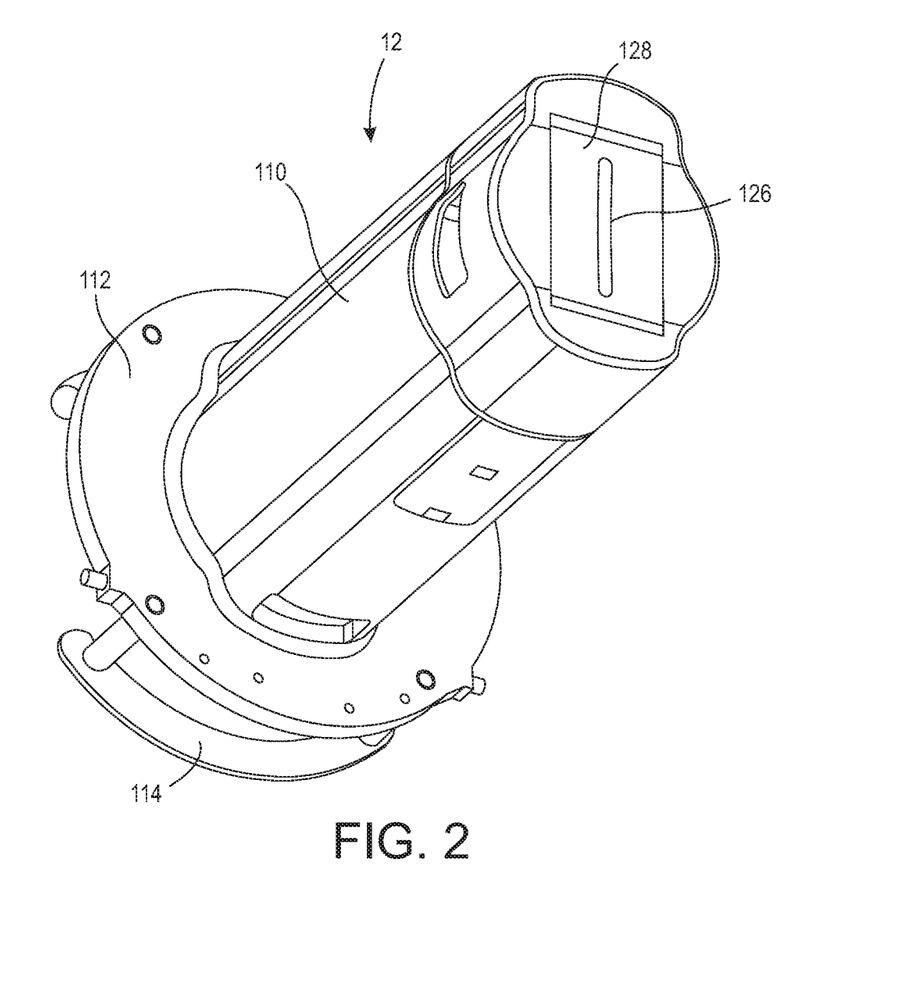
FIG. 2 is a perspective view of an ion source.

As shown in FIG. 2, the ion source 12 is an assembly of components that generally includes a source block 110 coupled to a flange 112 having handles 114 by which the source assembly 12 can be removed from the implanter. As is well known in the art, the source block 110 supports and defines a plasma or arc chamber (also known as an ion generating chamber) and an associated electron emitting cathode (not shown). As discussed in previously referenced U.S. Pat. No. 5,420,415, in the preferred embodiment of the ion source, the cathode is supported by the source block but is electrically isolated from the arc chamber. In its simplest terms, electrons of a sufficient energy are emitted into the arc chamber to ionize a gas within the chamber.

The arc chamber includes an extraction member 128 in the form of a plate defining an elongated, generally elliptically-shaped extraction or exit aperture 126, providing an exit for ions to be emitted from the arc chamber. As ions migrate from the arc chamber, they are accelerated therefrom by electric fields set up by the beam extraction assembly 28 (FIG. 1) positioned relative to the exit aperture 126. Additional details concerning one exemplary prior art ion source are disclosed in U.S. Pat. No. 5,026,997 to Benveniste et al., commonly assigned to the assignee of the present invention and incorporated by reference herein.

Ion Extraction Member and Extraction Aperture

Figure 3A:
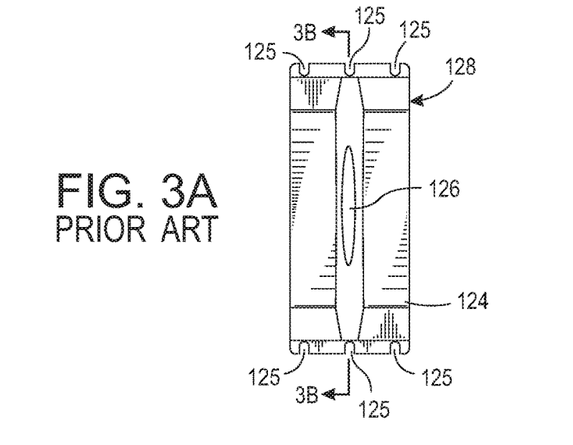
FIG. 3A is a front elevation or front plan view.
Figure 3B:
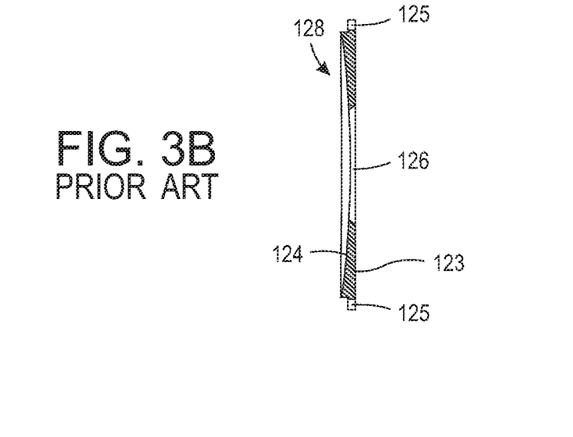
FIG. 3B is a sectional view as viewed from cut line 3B-38 of FIG. 3A.
Figure 3C:
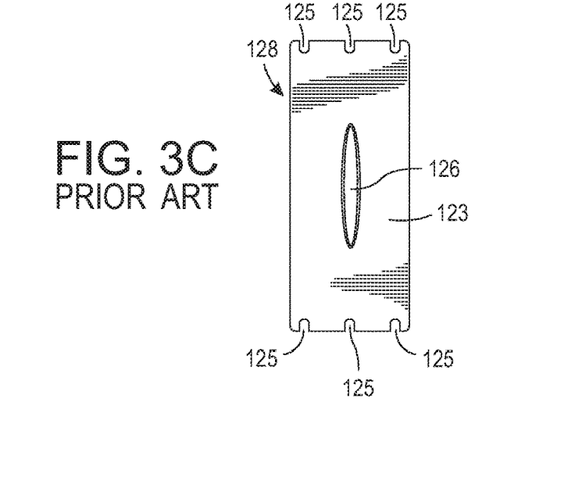
FIG. 3C is a back elevation or back plan view.

A typical extraction member 128, and the extraction aperture 126 defined thereby, as is generally known in the prior art is illustrated in FIGS. 3A, 38 and 3C. As can be seen, the extraction member is generally rectangular in shape and flat on one side 123, the side bearing against and facing the interior of the ion generating arc chamber. The opposite side 124 of the extraction member is concave or slightly inwardly bowed as can best be seen in FIG. 3B. The extraction member 128 can also include a plurality of peripheral positioning slots 125 typically situated at opposite ends of the member, for aid in alignment of the extraction aperture through which ions generated within the chamber can exit the chamber to be accelerated along the ion beam path by the extraction electrodes 28 (FIG. 1). The extraction electrode 128 is electrically energized and controllably biased with respect to an electrical potential of the arc chamber to accelerate ions exiting through the extraction aperture 126 away from the arc chamber. Heretofore, as can be seen in FIGS. 3A-3C, the extraction aperture 126 has been of a shape that can be defined as an elongated slit having a generally elliptical shape, which can also be loosely described as an elongated circle, stretched into a generally oval shape. An elliptical shape can be described in terms of a closed shape having a major and a minor axis defining its longest and shortest dimensions, respectively, wherein the minor axis defines the greatest width of the ellipse at its central point such that the width decreases when moving away from the central point of the elliptical shape along the length of the major axis.

Figure 4A:
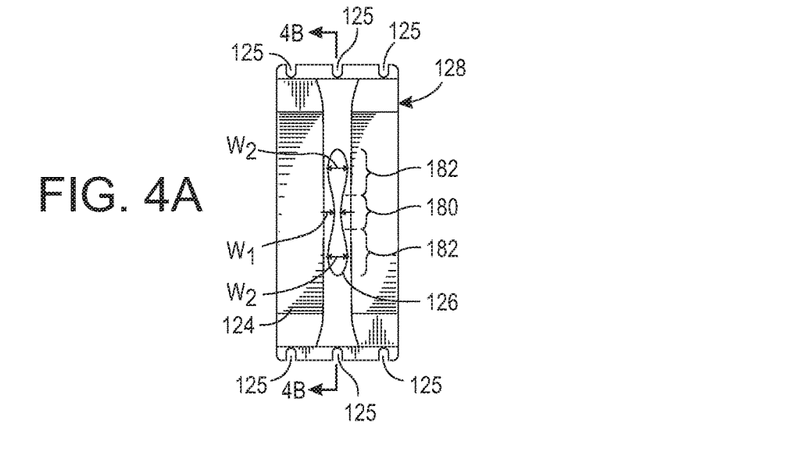
FIG. 4A is a front elevation view.
Figure 4B:
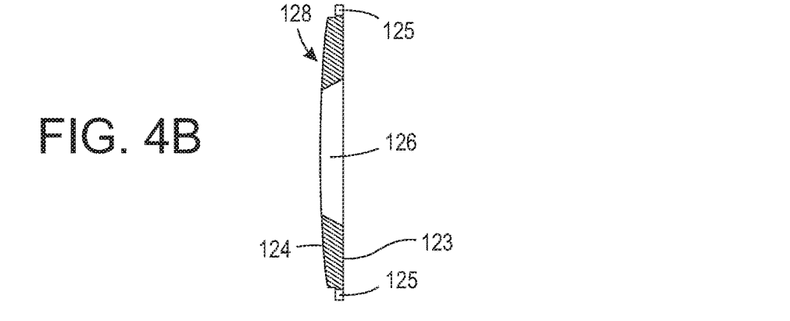
FIG. 4B is a sectional view as viewed from cut line 4B-4B of FIG. 3A.
Figure 4C:
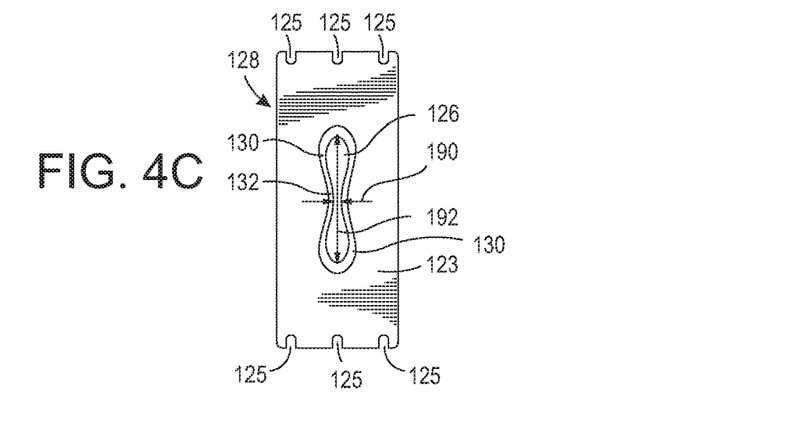
FIG. 4C is a back elevation or back plan view.

Turning to the present invention, as illustrated in FIGS. 4A-4C, the inventors have found that it may be beneficial and advantageous to provide an extraction member 128 associated with the ion source, wherein the extraction member 128 defines an aperture 126 having a tailored shape. The tailored shape can be defined as having a central portion 180 and first and second distal portions 182 extending from opposite sides of the central portion. The central portion 180 has a first width dimension $W_1$, while the opposed distal portions have a second width dimension $W_2$ that is greater than the first width dimension of the central portion. In a preferred embodiment as shown in FIGS. 4A-4C, the present invention replaces the typical elliptical shape of the extraction aperture of a prior art extraction member with a "dogbone" shaped aperture 178, wherein a central portion 180 of the aperture includes a first minimum width dimension $W_1$ that is less than a maximum width dimension $W_2$ associated with the opposed distal portions 182 of the aperture 126.

Described in another way, the extraction aperture 126 of the present invention includes a waist section located at a middle portion thereof, wherein the greatest width dimension associated with the waist is smaller than the greatest width dimensions associated with portions above and below the middle portion of the aperture.

Described in yet another way, as depicted in FIG. 4C, the extraction aperture of the present invention includes a lateral axis 190 extending along its width and a longitudinal axis 192 extending along its height, wherein the lateral axis and the longitudinal axis intersect at a central point of the aperture. The dimension of the lateral axis increases as a function of distance from the center along the longitudinal axis. Thus, the extraction aperture 126 of the present invention has a minimum dimension along a lateral axis 190 associated with the midpoint of the longitudinal axis 192 and a maximum dimension along axes parallel to the lateral axis at a distance extending away from the midpoint along the longitudinal axis 192.

In addition to the tailored shape of the present invention, the inventors have also found that it may be beneficial and advantageous to provide the tailored shape extraction member with a convex side profile as can best be seen at FIG. 4B. Thus, the extraction member 128 is generally flat on one side 123, which is the side exposed to the interior of the ion generation chamber. The opposite side 124 of the extraction member 128 is convex or slightly outwardly bowed such that a thickness or depth dimension of the extraction member 128 is greatest along the central portion, the waist, or the middle of the tailored extraction aperture and is gradually reduced in depth dimension along the longitudinal axis of the aperture such that the extraction member has a minimum thickness adjacent the terminating points of the aperture defined thereby. Thus, the extraction member of the present invention may have a side profile that is convex in shape such that a depth dimension of the extraction member is greatest in the vicinity of the central portion thereof and has a reduced depth dimension in the vicinity of the distal portions of the aperture.

Figure 5:
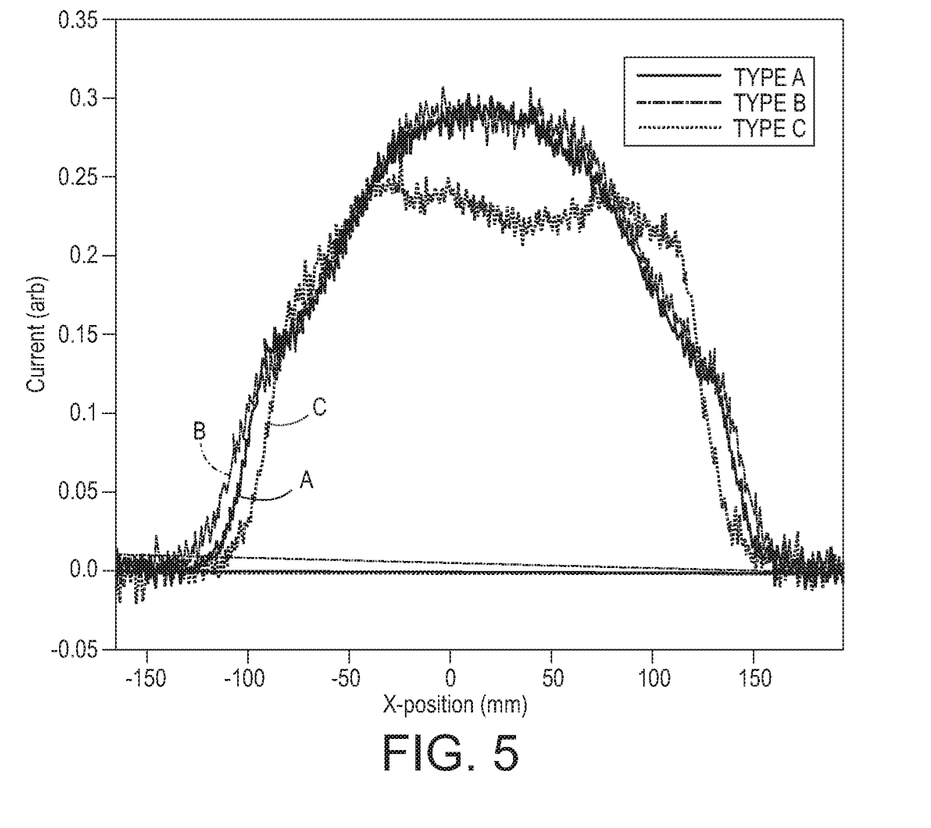
FIG. 5 is an illustration of measured beam current waveforms demonstrating typical beam current profiles associated with generally elliptical extraction apertures verses a beam current profile associated with the "dog-bone" shaped extraction aperture of the present invention.

FIG. 5 provides a graphical representation of the benefits and advantages provided by the tailored aperture shape of the present invention. FIG. 5 is an illustration of measured beam current waveforms for typical ion beams generated by an ion source as measured along the longitudinal axis of the extraction aperture, where the X-axis represents the position of the beam current measurement relative the center of the ion beam at the "0" X-position, and the Y-axis represents the measured beam current in arbitrary units. It can be seen that beam current waveforms labeled as "Type A" and "Type B" have Gaussian shapes typically associated with generally elliptical extraction apertures of the prior art. By contrast, the beam current waveform labeled "Type C" associated with the tailored extraction aperture of the present invention, has a plateau-like shape, which indicates a substantially uniform beam current across the longitudinal axis of the ion beam having increased beam current at positions further from the "0" X position, along the edges of the plateau. This more uniform beam current is particularly advantageous in pencil beam type systems having a substantial high aspect ratio beam profile.

It will be understood that the foregoing description or the so-called "dogbone" tailored shape extraction aperture is only one of various shapes contemplated by the present invention. Thus, in accordance with the "dogbone" shaped aperture, the aperture is defined by a plurality of opposing curvilinear sidewall sections 130 such that the extraction aperture 126 is curvilinear in plan. In the specific embodiment illustrated in FIGS. 4A-4C, the plurality of opposing curvilinear sidewall sections 130, 132 includes sidewalls 132 associated with the central portion that are opposingly convex in shape (associated with reference numeral 180), and sidewalls 130 associated with each of the first and second distal ends that are opposingly concave in shape (associated with reference numeral 182). The sidewalls 130 associated with the first and second distal ends are substantially elliptical in shape. The tailored shape may be symmetrical along the longitudinal axis 192 extending through the central portion and the first and second distal portions. Alternatively, the tailored shape may be asymmetrical along the longitudinal axis 192 extending through the central portion and the first and second distal portions. Likewise, the shape of the first and second distal portions can be either symmetrical or asymmetrical relative to the central portion or lateral axis 190.

Figure 6A:
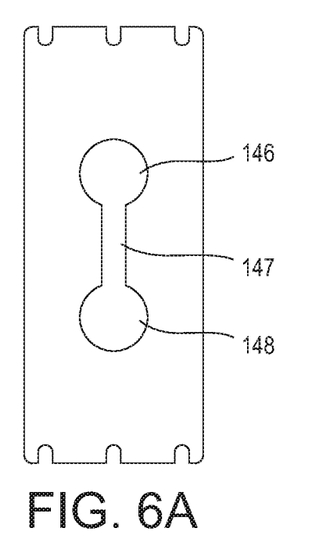
FIGS. 6A-6D are illustrations of extraction members defining various extraction aperture shapes in accordance with, and encompassed by, the present invention shown in front elevation or front plan view.
Figure 6B:
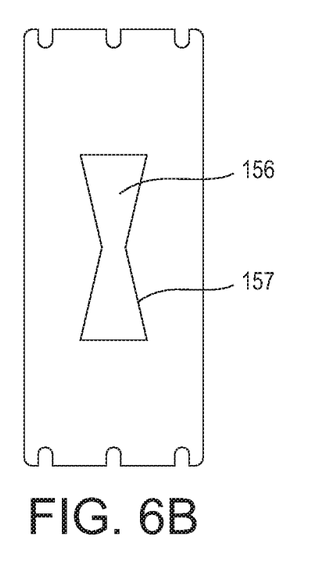

FIGS. 6A-6D provide illustrations in front elevation or front plan view of extraction members defining various alternative tailored extraction apertures in accordance with, and encompassed by, the present invention. For example, FIG. 6A, illustrates an alternative embodiment for a tailored extraction aperture 146 in accordance with the present invention, wherein the central portion 147 may have a substantially rectangular shape having parallel opposing sides and the shape of the first and second distal ends form a circular shape in plan. In another alternative embodiment, as shown in FIG. 6B, the extraction aperture 156 is generally "bowtie" in shape, comprising a plurality of opposing linear sidewall sections 157 such that the extraction aperture is linear in plan. In this embodiment, the opposing linear sidewall sections 157 associated with the first and second distal ends slope away from one another to provide a gradually increasing width dimension therebetween along a path of the longitudinal axis extending from the central portion to the first and second distal ends.

Figure 6C:
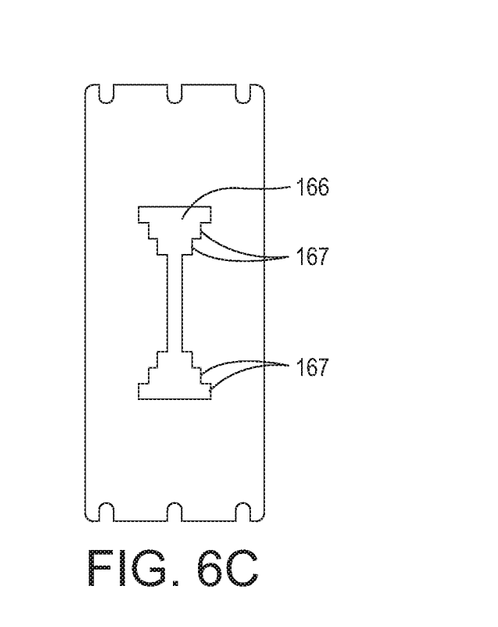
Figure 6D:
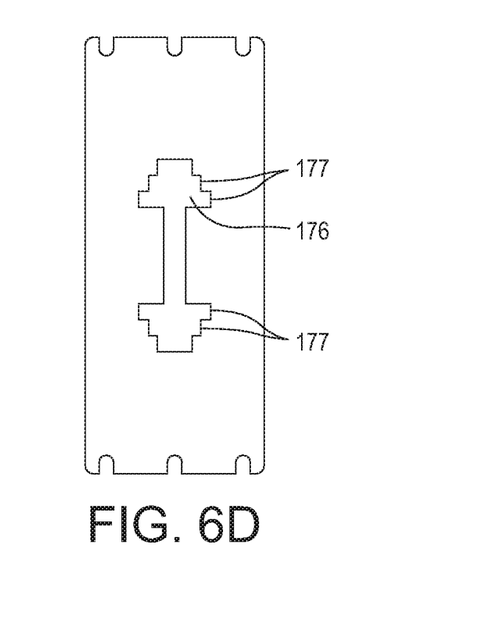

In yet another alternative embodiment, the extraction aperture has a plan profile that is generally "candlestick" in shape, a variant of the linear sidewall approach associated with FIG. 6B, wherein the opposing linear sidewall sections, as illustrated in FIG. 6C, can include first and second distal ends comprising a plurality of opposing lateral segments 167 separated by varying width dimension therebetween. Similarly, but in yet another embodiment, the extraction aperture has a plan profile that is generally "barbell" in shape, with opposing linear sidewall sections, as illustrated in FIG. 6D, that can include first and second distal ends comprising a plurality of opposing lateral segments 177 separated by varying width dimension therebetween with the opposing linear sidewall sections having a gradually decreasing width dimension therebetween along a path or longitudinal axis extending away from the central portion.

From the above description of a preferred embodiment of the invention, and many alternative variations thereof, those skilled in the art will perceive improvements, changes and modifications. The nature of the ion source extraction aperture and tailored shape thereof could vary depending on the source ionization material injected into the chamber interior, the desired beam shape and size, and/or the beam current uniformity requirements among various other operational characteristics. Improvements, changes and modifications within the skill of the art are intended to be covered by the appended claims. Thus, while the present invention has been described in some degree of particularity, it is to be understood that those of ordinary skill in the art may make certain additions or modifications to, or deletions from, the described present embodiment of the invention without departing from the spirit or scope of the invention, as set forth in the appended claims.

We claim:

1. An ion source, comprising:
    an ion source housing defining an ion generating chamber for confining a high density concentration of ions therein; and
    an extraction member associated with the ion source housing defining an extraction aperture for allowing ions to exit the ion generating chamber, wherein the extraction aperture has a tailored shape characterized by having a longitudinal axis and a lateral axis, the extraction aperture being further defined by:
    a central portion having a first width dimension extending along the lateral axis: and
    first and second distal portions extending from opposite sides of the central portion along the longitudinal axis, the opposed distal portions having a second width dimension extending parallel to the lateral axis that is greater than the first width dimension of the central portion;
    wherein the extraction member has a side profile that is convex such that a depth dimension of the extraction member is greatest adjacent the central portion of the tailored shape extraction aperture and has a reduced depth dimension adjacent the distal portions.

2. The ion source of claim 1, wherein the extraction aperture comprises a plurality of opposing curvilinear sidewall sections such that the extraction aperture is curvilinear in plan.

3. The ion source of claim 2, wherein the plurality of opposing curvilinear sidewall sections includes:
   sidewalls associated with the central portion being opposingly convex in shape; and
   sidewalls associated with each of the first and second distal ends being opposingly concave in shape.

4. The ion source of claim 2, wherein the sidewalls associated with the first and second distal ends form a circular shape in plan.

5. The ion source of claim 2, wherein the sidewalls associated with the first and second distal ends form an elliptical shape in plan.

6. The ion source of claim 1, wherein the tailored shape is symmetrical along a central axis extending through the central portion and the first and second distal portions.

7. The ion source of claim 1, wherein the tailored shape is asymmetrical along a central axis extending through the central portion and the first and second distal portions.

8. The ion source of claim 1, wherein the first and second distal portions are symmetrical relative to the central portion.

9. The ion source of claim 1, wherein the first and second distal portions are asymmetrical relative to the central portion.

10. The ion source of claim 1, wherein the extraction aperture comprises a plurality of opposing linear sidewall sections such that the extraction aperture is linear in plan.

11. The ion source of claim 10, wherein the opposing linear sidewall sections associated with the first and second distal ends have a gradually increasing width dimension therebetween along a path extending from the central portion to the first and second distal ends.

12. The ion source of claim 10, wherein the opposing linear sidewall sections associated with the first and second distal ends comprise a plurality of opposing lateral segments separated by varying width dimension therebetween.

13. An ion implanter, comprising;
    an ion source including
        a housing defining an arc chamber for confining a high density concentration of ions therein; and
        an extraction member associated with the ion source housing defining an extraction aperture for allowing ions to exit the arc chamber, wherein the extraction aperture has a tailored shape characterized by having a longitudinal axis and a lateral axis, the extraction aperture being further defined by:
        a central portion having a first width dimension extending along the lateral axis: and
        first and second distal portions extending from opposite sides of the central portion along the longitudinal axis, the opposed distal portions having a second width dimension extending parallel to the lateral axis that is greater than the first width dimension of the central portion;
    wherein the extraction member has a side profile that is convex such that a depth dimension of the extraction member is greatest adjacent the central portion of the tailored shape extraction aperture and has a reduced depth dimension adjacent the distal portions.

14. The ion implanter of claim 13, wherein the tailored shape of the extraction aperture has a plan profile that is generally dogbone in shape.

15. The ion implanter of claim 13, wherein the tailored shape of the extraction aperture has a plan profile that is generally bowtie in shape.

16. The ion implanter of claim 13, wherein the tailored shape of the extraction aperture has a plan profile that is generally candlestick in shape.

17. The ion implanter of claim 13, wherein the tailored shape of the extraction aperture has a plan profile that is generally barbell in shape.

* * * * *